(12) United States Patent
Kwon et al.

(10) Patent No.: US 8,958,251 B2
(45) Date of Patent: Feb. 17, 2015

(54) NONVOLATILE MEMORY DEVICE AND METHOD OF IMPROVING A PROGRAM EFFICIENCY THEREOF

(71) Applicant: Samsung Electronics Co., Ltd, Suwon-si, Gyeonggi-do (KR)

(72) Inventors: Ohsuk Kwon, Seoul (KR); Sang-Hyun Joo, Hwaseong-si (KR); HyeongJun Kim, Anyang-si (KR); Kitae Park, Seongnam-si (KR); Seung-Hwan Shin, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/913,710

(22) Filed: Jun. 10, 2013

(65) Prior Publication Data

US 2013/0336071 A1 Dec. 19, 2013

(30) Foreign Application Priority Data

Jun. 19, 2012 (KR) .................. 10-2012-0065610

(51) Int. Cl.
| | |
|---|---|
| *G11C 16/06* | (2006.01) |
| *G11C 16/10* | (2006.01) |
| *G11C 16/24* | (2006.01) |
| *G11C 16/34* | (2006.01) |

(52) U.S. Cl.
CPC ................ *G11C 16/10* (2013.01); *G11C 16/24* (2013.01); *G11C 16/3459* (2013.01)
USPC ............ 365/185.22; 365/185.25; 365/185.17; 365/185.11; 365/189.09

(58) Field of Classification Search
CPC ........ G11C 16/06; G11C 11/34; G11C 16/34; G11C 14/00; G11C 16/04; G11C 16/10; G11C 16/24
USPC ............. 365/185.22, 185.25, 185.17, 185.11, 365/189.09
See application file for complete search history.

(56) References Cited

U.S. PATENT DOCUMENTS

| | | | |
|---|---|---|---|
| 7,755,961 | B2 | 7/2010 | Rao |
| 2007/0121398 | A1 | 5/2007 | Bellows et al. |
| 2009/0003084 | A1* | 1/2009 | Kim et al. ................ 365/185.29 |
| 2009/0141570 | A1 | 6/2009 | Hsu et al. |
| 2009/0327660 | A1 | 12/2009 | Bains et al. |
| 2010/0074015 | A1 | 3/2010 | Chandrasekhar et al. |

* cited by examiner

*Primary Examiner* — Thong Q Le
(74) *Attorney, Agent, or Firm* — Ellsworth IP Group PLLC

(57) ABSTRACT

A nonvolatile memory device includes a memory cell array including a plurality of memory cells, a page buffer circuit connected with the memory cell array via a plurality of bit lines and configured to selectively pre-charge the plurality of bit lines, and control logic configured to control the page buffer circuit such that a pre-charge voltage is applied to selected bit lines of the plurality of bit lines during a first time at a read operation and such that a pre-charge voltage is applied to selected bit lines of the plurality of bit lines during a second time different from the first time at a verification read operation. The second time is determined on the basis of the number of selected bit lines of the plurality of bit lines at the verification read operation.

20 Claims, 13 Drawing Sheets

NONVOLATILE MEMORY DEVICE AND METHOD OF IMPROVING A PROGRAM EFFICIENCY THEREOF

CROSS-REFERENCE TO RELATED APPLICATIONS

A claim for priority under 35 U.S.C. §119 is made to Korean Patent Application No. 10-2012-0065610 filed Jun. 19, 2012, in the Korean Intellectual Property Office, the entire contents of which are hereby incorporated by reference in its entirety.

BACKGROUND

1. Field

The present general inventive concept described herein relates to a nonvolatile memory device and a method of improving program efficiency of the nonvolatile memory device.

2. Description of the Related Art

A semiconductor memory device may be volatile (hereinafter, referred to as a volatile memory device) or nonvolatile (hereinafter, referred to as a nonvolatile memory device).

Nonvolatile memory devices may include a mask read-only memory (MROM), a programmable ROM (PROM), an erasable programmable ROM (EPROM), an electrically erasable programmable ROM (EEPROM), etc.

A flash memory device may be a typical nonvolatile memory device. The flash memory device may have a cell string structure. A cell string may include a string selection transistor connected with a string selection line, memory cells connected respectively with word lines, and a ground selection transistor connected with a ground selection line. The string selection transistor may be connected with a bit line, and the ground selection transistor may be connected with a common source line.

At a read operation and a verification read operation, a pre-charge time may become longer as a result of a coupling capacitance among bit lines.

SUMMARY

The present general inventive concept provides a nonvolatile memory device to control a pre-charge time of a program verification read operation when data is programmed therein, thereby improving program efficiency of the nonvolatile memory device, and a method thereof.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing a nonvolatile memory device including a memory cell array including a plurality of memory cells, a page buffer circuit connected with the memory cell array via a plurality of bit lines and configured to selectively pre-charge the plurality of bit lines, and control logic configured to control the page buffer circuit such that a pre-charge voltage is applied to selected bit lines of the plurality of bit lines during a first time at a read operation and such that a pre-charge voltage is applied to selected bit lines of the plurality of bit lines during a second time different from the first time at a verification read operation. The second time may be determined based on a number of selected bit lines of the plurality of bit lines at the verification read operation.

In example embodiments, the second time may be shorter than the first time.

In example embodiments, the second time may be shortened when the number of bit lines selected at the verification read operation decreases.

In example embodiments, the page buffer circuit may include a selective pre-charge unit configured to apply a pre-charge voltage to selected bit lines of the plurality of bit lines, and a latch unit connected with the plurality of bit lines and the selective pre-charge unit and configured to latch data to be programmed at the memory cell array.

In example embodiments, the selective pre-charge unit may include selection transistors connected respectively with the plurality of bit lines and configured to apply a pre-charge voltage to selected bit lines.

In example embodiments, the selective pre-charge unit may further include ground transistors connected with the plurality of bit lines and configured to ground unselected bit lines.

In example embodiments, the number of bit lines selected at the verification read operation may be determined on the basis of data to be programmed at the memory cell array.

In example embodiments, the number of bit lines selected at the verification read operation may be determined on the basis of the number of '0' bits included in data to be programmed at the memory cell array.

In example embodiments, the second time may be reduced when the number of '0' bits included in data to be programmed at the memory cell array increases.

The foregoing and/or other features and utilities of the present general inventive concept may also be achieved by providing a nonvolatile memory device including a memory cell array including a plurality of memory cells, a page buffer circuit connected with the memory cell array via a plurality of bit lines and configured to selectively pre-charge the plurality of bit lines, and control logic configured to control the page buffer circuit such that a pre-charge voltage is applied to selected bit lines of the plurality of bit lines during a first time at a read operation and such that a pre-charge voltage is applied to selected bit lines of the plurality of bit lines during a second time different from the first time at a verification read operation. The second time may be determined based on a number of program loops at the verification read operation.

In example embodiments, the second time may be shorter than the first time.

In example embodiments, the second time may be shortened when the number of program loops increases.

The foregoing and/or other features and utilities of the present general inventive concept may also be achieved by providing a nonvolatile memory device including a memory cell array including a plurality of memory cells, a page buffer circuit connected with the memory cell array via a plurality of bit lines and configured to selectively pre-charge the plurality of bit lines, and control logic configured to control the page buffer circuit such that a pre-charge voltage is applied to selected bit lines of the plurality of bit lines during a first time at a read operation and such that a pre-charge voltage is applied to selected bit lines of the plurality of bit lines during a second time different from the first time at a verification read operation. The second time may be determined based on a program state to be verified at a verification read operation.

In example embodiments, the second time may be shorter than the first time.

In example embodiments, the second time may be shortened when a threshold voltage of a program state to be verified increases.

The foregoing and/or other features and utilities of the present general inventive concept may also be achieved by providing a method of improving program efficiency of a nonvolatile memory device, the method including selectively pre-charging a plurality of bit lines connected with a memory cell array, applying a pre-charge voltage to the selected bit lines during a first time at a read operation, and applying another pre-charge voltage to the selected bit lines during a second time different from the first time at a verification read operation, wherein the second time is determined based on a number of selected bit lines of the plurality of bit lines at the verification read operation.

The foregoing and/or other features and utilities of the present general inventive concept may also be achieved by providing a method of improving program efficiency of a nonvolatile memory device, the method including selectively pre-charging a plurality of bit lines connected with a memory cell array, applying a pre-charge voltage to the selected bit lines during a first time at a read operation, and applying another pre-charge voltage to the selected bit lines during a second time different from the first time at a verification read operation, wherein the second time is determined on the basis of the number of program loops at the verification read operation.

The foregoing and/or other features and utilities of the present general inventive concept may also be achieved by providing a method of improving program efficiency of a nonvolatile memory device, the method including selectively pre-charging a plurality of bit lines connected with a memory cell array, applying a pre-charge voltage to the selected bit lines during a first time at a read operation, and applying another pre-charge voltage to the selected bit lines during a second time different from the first time at a verification read operation, wherein the second time is determined on the basis of a program state to be verified at a verification read operation.

The foregoing and/or other features and utilities of the present general inventive concept may also be achieved by providing a method of improving program efficiency of a nonvolatile memory device, the method including selecting memory cells to be programmed by a program voltage, determining a number of the selected memory cells to perform program verification, pre-charging the selected memory cells according to a pre-charge time determined based on the number of the selected memory cells, performing a program verification read operation with respect to the selected memory cells, and determining whether the selected memory cells reach a target program state based on a result of the verification read operation.

The foregoing and/or other features and utilities of the present general inventive concept may also be achieved by providing a method of improving program efficiency of a nonvolatile memory device, the method including selecting memory cells to be programmed according to input program data, pre-charging bit lines corresponding respectively to the selected memory cells during a pre-charge time determined based on the input program data, performing a program verification read operation on the selected memory cells according to voltages used during the pre-charging, and determining whether the selected memory cells reach a target program state according to a result of the program verification read operation.

The foregoing and/or other features and utilities of the present general inventive concept may also be achieved by providing a method of improving program efficiency of a nonvolatile memory device, the method including selecting memory cells to be programmed by a first loop program voltage corresponding to a target program state, pre-charging bit lines corresponding respectively to the selected memory cells during a pre-charge time determined based on the target program state, performing a program verification read operation on the selected memory cells according to voltages used during the pre-charging, determining whether the selected memory cells reach the target program state according to a result of the program verification read operation, and performing a next program loop if the selected memory cells are determined not to have reached the target program state.

The foregoing and/or other features and utilities of the present general inventive concept may also be achieved by providing a method of improving program efficiency of a nonvolatile memory device, the method including selecting memory cells to be programmed by a program voltage at an nth loop, pre-charging bit lines corresponding respectively to the selected memory cells during a pre-charge time determined based on a program loop number, performing a program verification read operation on the selected memory cells according to voltages used during the pre-charging, determining whether the selected memory cells reach a target program state according to a result of the program verification read operation, and applying an increased program voltage such that a program operation is performed at an (n+1)th program loop if the selected memory cells are determined not to have reached the target program state.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
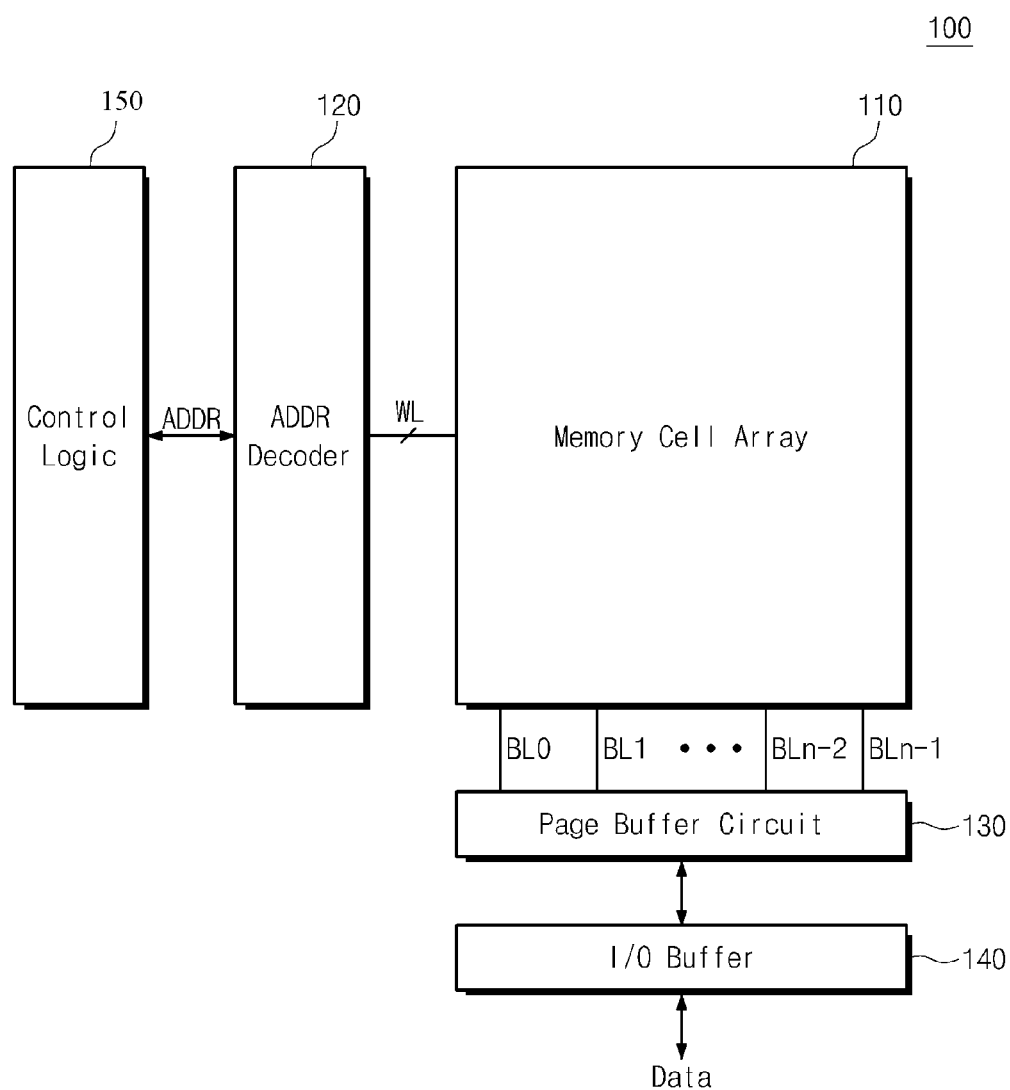
FIG. 1 is a block diagram schematically illustrating a nonvolatile memory device according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device 100 according to an exemplary embodiment of the present general inventive concept. Referring to FIG. 1, the nonvolatile memory device 100 may include a memory cell array 110, an address decoder 120, a page buffer circuit 130, an input/output (I/O) buffer 140, and control logic 150.

The nonvolatile memory device 100 may be configured to control a pre-charge time of a selected bit line during a verification read operation in response to a capacitance of the selected bit line. A program efficiency of the nonvolatile memory device 100 may be improved by shortening a program verification time, to be explained in detail later.

The memory cell array 110 may be connected with the address decoder 120 via word lines and selection lines. The memory cell array 110 may be connected with the page buffer circuit 130 via bit lines BL0 to BLn−1. The memory cell array 110 may include a plurality of cell strings. Each of the cell strings may form a channel in a vertical or a horizontal direction. The word lines of the memory cell array 110 may be stacked in the vertical direction.

The address decoder 120 may select one of the memory blocks of the memory cell array 110 in response to an address ADD. The address decoder 120 may select one of word lines of the selected memory block. The address decoder 120 may provide the selected word line with a voltage from the control logic 150. During a program operation, the address decoder 120 may provide a program voltage and a verification voltage to a selected word line and a pass voltage to unselected word lines. During a read operation, the address decoder 120 may provide a selection read voltage to the selected word line and a non-selection read voltage to the unselected word lines.

The page buffer circuit 130 may act as a write driver or as a sense amplifier according to a mode of operation. During a program operation, the page buffer circuit 130 may provide a bit line of the memory cell array 110 with a bit line voltage corresponding to program data. During a read operation, the page buffer circuit 130 may sense data stored at a selected memory cell via a bit line. The page buffer circuit 130 may latch the sensed data to transfer it to the input/output buffer 140. The page buffer circuit 130 may include page buffers connected respectively with the bit lines BL0 to BLn−1.

During a program operation, the input/output buffer 140 may transfer input program data to the page buffer circuit 130. During a read operation, the input/output buffer 140 may transfer read data provided from the page buffer circuit 130 to an external device. The input/output buffer 140 may transfer input command and address to the control logic 150 and the address decoder 120.

The control logic 150 may control the page buffer circuit 130 in response to a command and an address from an external device. To compensate for a sensing noise at a read operation, the control logic 150 may control the page buffer circuit 130 such that memory cells are sensed according to a coarse-fine sensing operation.

Regarding the coarse-fine sensing operation, selected memory cells may be sequentially sensed two times using different read voltages. This may enable a sensing noise to be reduced. First, a coarse sensing operation may be performed, during which selected memory cells are sensed at a level lower than a target level. During the coarse sensing operation, off cells of the sensed cells may be selected. Subsequently, a fine sensing operation may be performed, during which the selected off cells are sensed at the target level. Data sensed and latched at the fine sensing operation may be output as final read data. A portion of the memory cells determined to be the off cells during the coarse sensing operation may also be selected during the fine sensing operation. Capacitance among bit lines during the fine sensing operation may increase according to a distribution of the sensed memory cells as compared with the capacitance among bit lines during the coarse sensing operation. Thus, during a read operation, there may be required a pre-charge time sufficient to overcome the capacitance among bit lines.

The control logic 150 may be configured to conduct a verification read operation of a program operation. The verification read operation may be performed to verify whether a threshold voltage of a memory cell reaches a target program state. The verification read operation may be simultaneously performed with respect to memory cells connected with a selected word line.

The memory cells may include memory cells necessitating verification read operation and memory cells not necessitating verification read operation. For example, a memory cell having a target threshold voltage higher than the target program state may not require the verification read operation. Alternatively, a memory cell having a threshold voltage reaching toward the target threshold voltage may also not require the verification read operation.

To compensate for a sensing noise during a verification read operation, the control logic 150 may control the page buffer circuit 130 such that memory cells are sensed according to a selective verification operation. During the selective verification operation, memory cells to be program verified may be selectively pre-charged.

For example, during the selective verification operation, the page buffer circuit 130 may selectively pre-charge bit lines corresponding respectively to memory cells to be program verified.

According to the above-described verification read operation of the present general inventive concept, memory cells to be program verified may be selectively pre-charged. In this case, coupling capacitance among bit lines during a verification read operation may be reduced as compared with coupling capacitance among bit lines during a read operation. The control logic 150 may control a time taken to pre-charge a bit line so as to correspond to the reduced coupling capacitance among bit lines.

The nonvolatile memory device 100 may be configured to control a time taken to pre-charge a selected bit line during a verification read operation. As such, a program verification time may be shortened. Thus, it is possible to improve program efficiency of the nonvolatile memory device 100.

Figure 2:
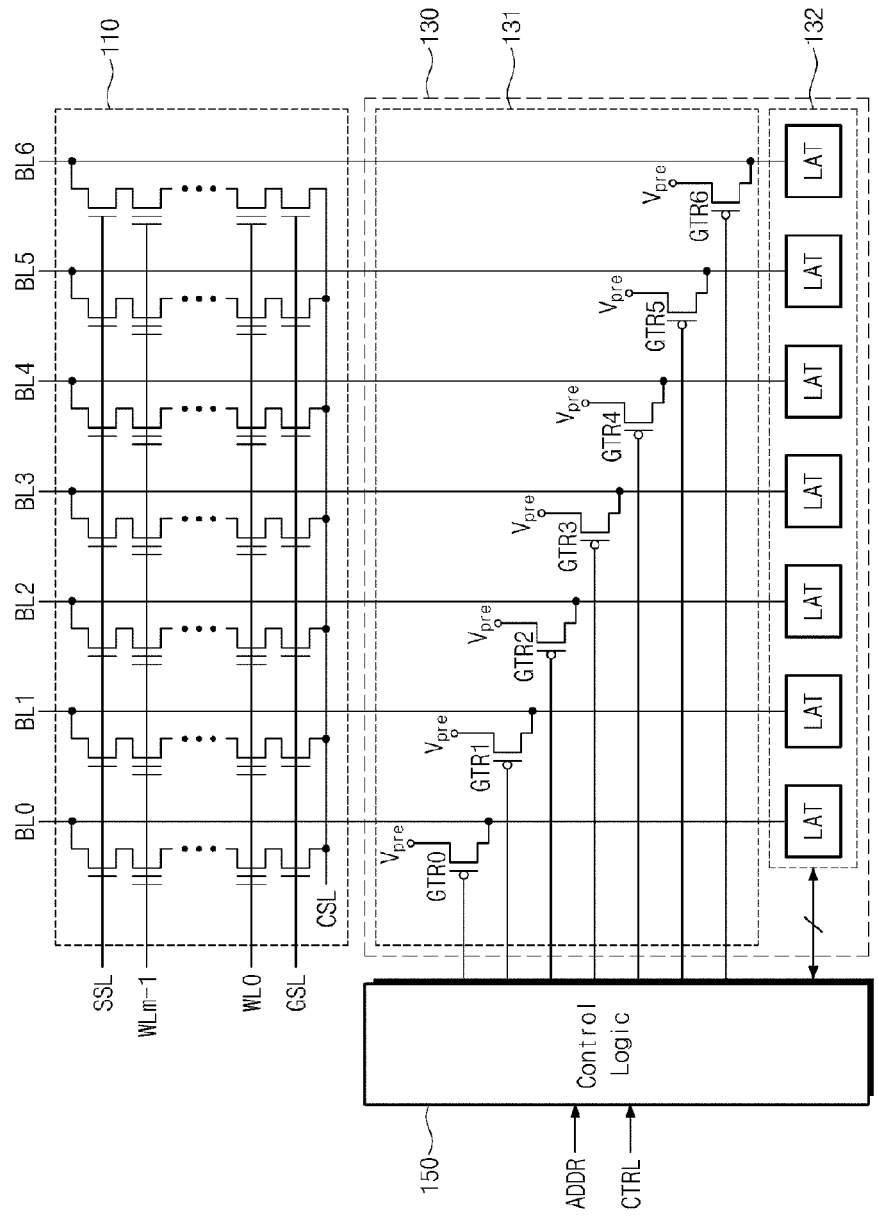
FIG. 2 is a block diagram schematically illustrating a memory cell array, a page buffer circuit, and control logic according to an exemplary embodiment of the present general inventive concept.

FIG. 2 is a block diagram schematically illustrating a memory cell array 110, a page buffer circuit 130, and control logic 150 according to an exemplary embodiment of the present general inventive concept.

The memory cell array 110 may be connected with a plurality of bit lines. In FIG. 2, seven bit lines BL0 through BL6 and the page buffer circuit 130 associated with the seven bit lines BL0 through BL6 are exemplarily illustrated. The page buffer circuit 130 may include a selective pre-charge unit 131 and a latch unit 132.

The selective pre-charge unit 131 may be configured to pre-charge selected bit lines in response to a control of control logic 150. The selective pre-charge unit 131 may include transistors GTR0 through GTR6. FIG. 2 illustrates an example in which the transistors GTR0 through GTR6 are included within the page buffer circuit 130. However, the present general inventive concept is not limited thereto. For example, the transistors GTR0 through GTR6 can be formed outside the page buffer circuit 130. The selective pre-charge unit 131 may include ground transistors to ground unselected bit lines.

The latch unit 132 may include latches LAT0 through LAT6 connected respectively with the bit lines BL0 through BL6. The latches LAT0 through LAT6 may write data at selected memory cells via the bit lines BL0 through BL6, and may sense data from the selected memory cells via the bit lines BL0 through BL6.

According to the above description, a nonvolatile memory device 100 of the present general inventive concept may be configured to refuse precharging unselected bit lines during a fine sensing operation and a program verification read operation.

During a program verification read operation, the control logic 150 may control the page buffer circuit 130 to adjust a pre-charge time. For example, at the program verification read operation, the control logic 150 may adjust a pre-charge time in view of capacitance of selected bit lines.

As each bit line capacitance decreases, a time constant of each bit line may decrease. When a time constant decreases, there may be shortened a time taken to pre-charge bit lines up to a target voltage level. Accordingly, the control logic 150 may shorten a time taken to pre-charge bit lines.

A pre-charge time control method of the control logic 150 may not be limited to the above description. The control logic 150 may control the selective pre-charge unit 131 to adjust a pre-charge time on selected bit line.

Program efficiency of the nonvolatile memory device 100 may be improved by controlling of a pre-charge time such that a program verification time is shortened.

Figure 3:
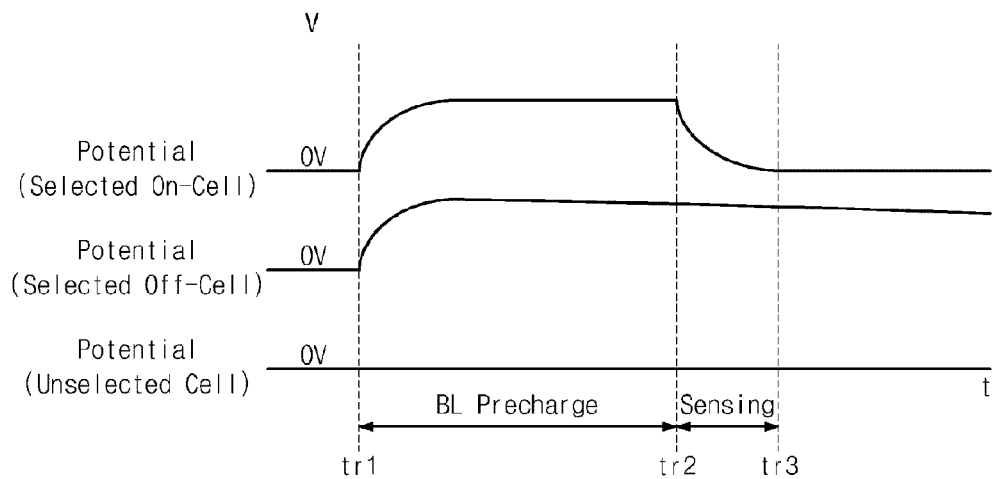
FIG. 3 is a timing diagram illustrating potentials of bit lines during a read operation according to an exemplary embodiment of the present general inventive concept.

FIG. 3 is a timing diagram illustrating potentials of bit lines during a read operation according to an exemplary embodiment of the present general inventive concept. Referring to FIG. 3, a pre-charge voltage may be applied to bit lines corresponding respectively to selected memory cells.

During a pre-charge time tr1 to tr2, the pre-charge voltage may be applied to bit lines corresponding respectively to selected memory cells (hereinafter, referred to as selected bit lines). Bit lines (corresponding respectively to unselected memory cells hereinafter, referred to as unselected bit lines) may be grounded. During a read operation, the pre-charge time tr1 to tr2 may be determined to correspond to maximum capacitance of the selected bit lines.

During a sensing time tr2 to tr3, a state of the selected memory cell may be determined according to a variation in a potential of a bit line. If the selected memory cell is an off-cell corresponding to a program state, a potential of the bit line may be maintained. If the selected memory cell is an on-cell corresponding to an erase state, a potential of the bit line may decrease. The reason may be that a current flows through the selected memory cell.

During the read operation, the pre-charge time tr1 to tr2 may be determined with regard to a worst case scenario. The worst case may indicate a case in which capacitance of selected bit lines becomes maximum by capacitance among bit lines. This will be more fully described with reference to FIG. 4.

Figure 4:
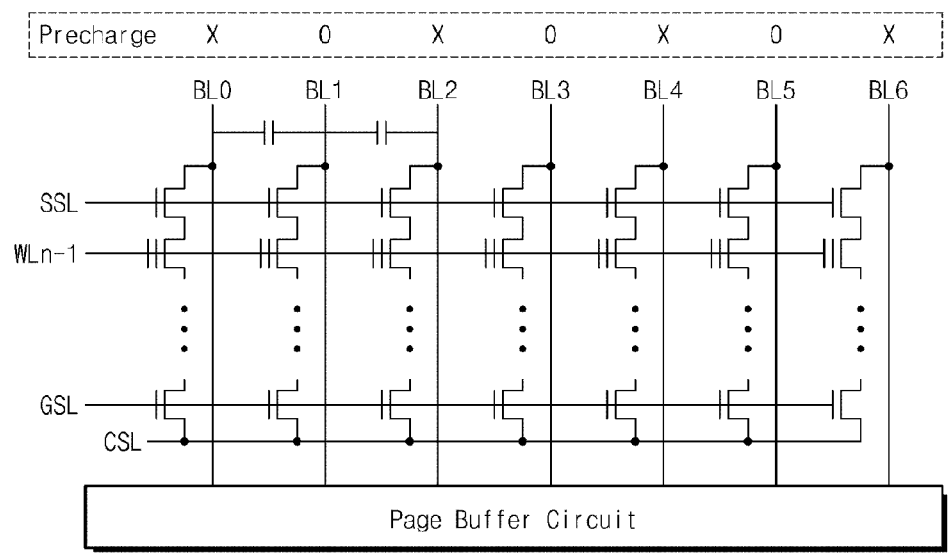
FIG. 4 is a diagram illustrating a worst case during a read operation.

FIG. 4 is a diagram illustrating a worst case during a read operation. Referring to FIG. 4, adjacent bit lines may be selected to be complementary. The term "complementary" may be used to indicate that bit lines adjacent to a selected bit line are unselected and bit lines adjacent to an unselected bit line are selected.

During a pre-charge operation, a pre-charge voltage may be applied to selected bit lines BL1, BL3, and BL5, and unselected bit lines BL0, BL2, BL4, and BL6 may be grounded. A time taken to charge the selected bit lines BL1, BL3, and BL5 up to a target level may be delayed by coupling capacitance between adjacent bit lines.

As illustrated in FIG. 4, if adjacent bit lines are selected to be complementary, a voltage difference may exist between adjacent bit lines when a pre-charge voltage is applied. As such, an effect of coupling capacitance on bit lines may increase. Since a time taken for the pre-charge voltage to reach a target level (or, a normal level) is delayed, a pre-charge time may increase.

During a read operation, a page buffer may apply the pre-charge voltage to the selected bit lines BL1, BL3, and BL5 according to a pre-charge time determined to correspond to a coupling capacitance generated as illustrated in FIG. 4. In other words, at the read operation, the pre-charge time may be determined to correspond to the worst case.

Unlike a read operation, a program verification operation may be iteratively performed. If the program verification operation is performed under a condition that a pre-charge voltage is applied during the same pre-charge time as that at a read operation, a program verification time may increase.

Figure 5:
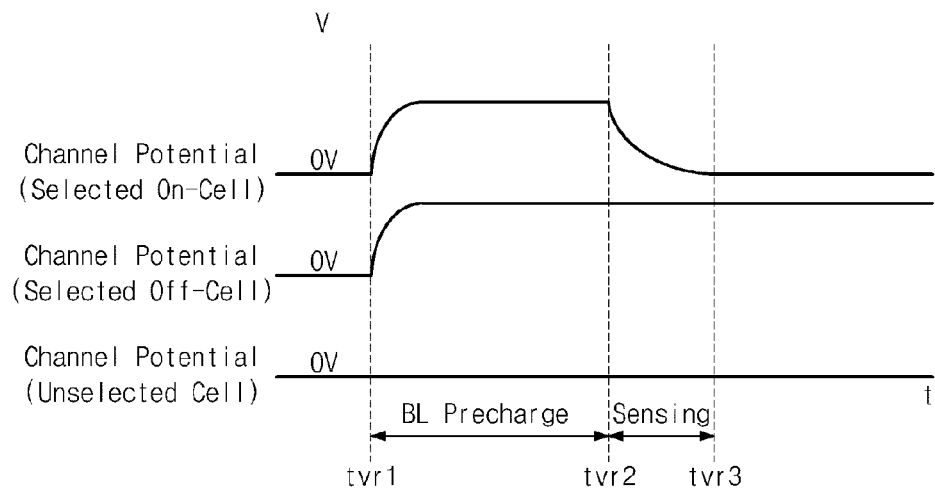
FIG. 5 is a timing diagram illustrating potentials of bit lines during a verification read operation of a program operation according to an exemplary embodiment of the present general inventive concept.

FIG. 5 is a timing diagram illustrating potentials of bit lines during a verification read operation of a program operation according to an exemplary embodiment of the present general inventive concept. Referring to FIG. 5, a pre-charge time during a verification read operation may be shortened compared with a pre-charge time during a read operation.

During a pre-charge time tvr1 to tvr2, a pre-charge voltage may be applied to bit lines corresponding respectively to selected memory cells (hereinafter, referred to as selected bit lines). Bit lines corresponding respectively to unselected memory cells (hereinafter, referred to as unselected bit lines) may be grounded. At a verification read operation, the pre-charge time tvr1 to tvr2 may be determined to correspond to maximum capacitance of the selected bit lines.

During a sensing time tvr2 to tvr3, a state of the selected memory cell may be determined according to a variation in a potential of a bit line. If the selected memory cell is an off-cell corresponding to a program state, a potential of the bit line may be maintained. If the selected memory cell is an on-cell corresponding to an erase state, a potential of the bit line may decrease. The reason may be that a current flows through the selected memory cell.

During the verification read operation, there may be selectively pre-charged bit lines corresponding respectively to memory cells to be program verified. During the verification read operation, the control logic 150 may control the pre-charge time tvr1 to tvr2 to correspond to a capacitance of the selected bit lines.

Figure 6:
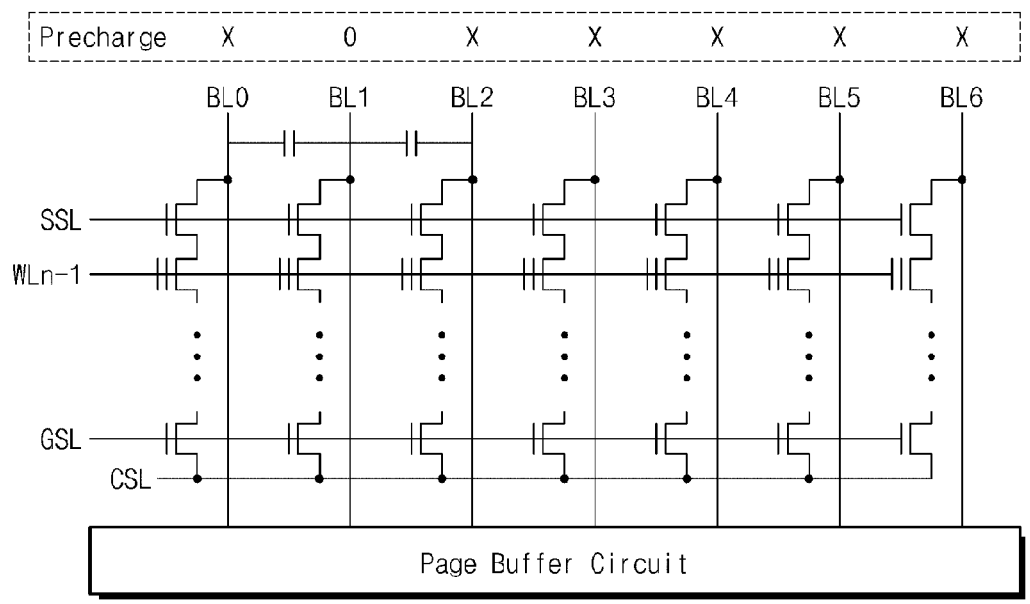
FIG. 6 is a diagram illustrating a worst case during a read operation.

FIG. 6 is a diagram illustrating the worst case during a read operation. Referring to FIG. 6, bit lines selected during a verification read operation may be affected less than the selected bit lines of FIG. 4.

During a pre-charge operation, a pre-charge voltage may be applied to a selected bit line BL1, and unselected bit lines BL0 and BL2 through BL6 may be grounded. As described with reference to FIG. 4, a time taken to charge the selected bit line BL1 up to a target level may be delayed by a coupling capacitance between adjacent bit lines.

As illustrated in FIG. 6, a number of memory cells selected during the verification read operation may be less than that a number of memory cells selected during a read operation. Compared with a case illustrated in FIG. 4, influence of coupling capacitance on a bit line may be reduced. As such, a time taken for a pre-charge voltage to reach a target level (or, a normal level) may be shortened as compared with the time taken for a pre-charge voltage to reach a target level (or, a normal level) with reference to FIG. 4.

The control logic 150 of FIG. 1 may shorten a pre-charge time tvr1 to tvr2, as illustrated in FIG. 5, as compared with a pre-charge time tr1 to tr2, as illustrated in FIG. 3 during a read operation. Accordingly, program efficiency may be improved by controlling a pre-charge time such that a program verification time is shortened.

Figure 7:
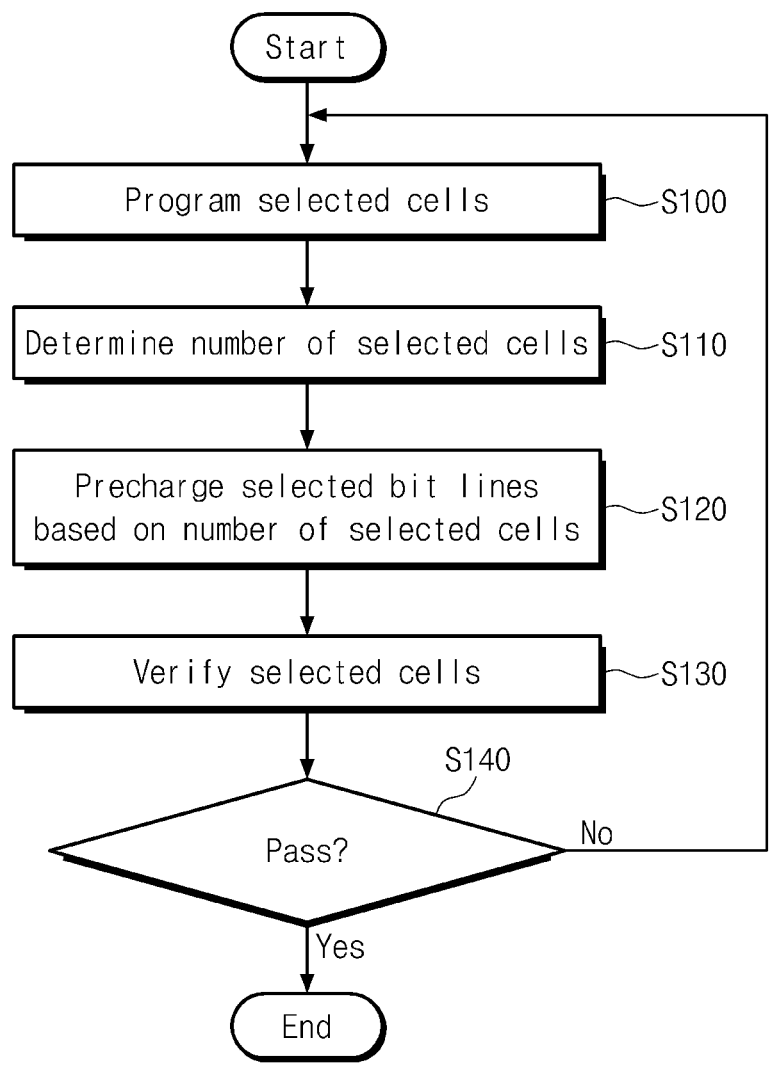
FIG. 7 is a flow chart illustrating a program method according to an exemplary embodiment of the present general inventive concept.

FIG. 7 is a flow chart illustrating a program method according to an exemplary embodiment of the present general inventive concept. Referring to FIG. 7, the control logic 150 may control a pre-charge time according to the number of memory cells selected during a verification read operation. As the number of selected bit lines decreases, influence of coupling capacitance on bit lines may decrease. The control logic 150 may shorten a pre-charge time according to the decreased coupling capacitance. Thus, it is possible to shorten a time to perform program verification.

In operation S100, selected memory cells may be programmed by a program voltage.

In operation S110, a number of the selected memory cells may be determined to perform program verification.

In operation S120, bit lines corresponding respectively to the selected memory cells may be pre-charged according to a pre-charge time determined based on the number of the selected memory cells.

In operation S130, a program verification read operation may be performed with respect to the selected memory cells.

In operation S140, whether the selected memory cells reach a target program state may be determined based on a result of the verification read operation. If the selected memory cells are determined not to reach a target program state, the method proceeds to operation S100. If the selected memory cells are determined to reach a target program state, the method may be ended.

According to the above description, program efficiency may be improved by controlling a pre-charge time such that a program verification time is shortened.

Figure 8:
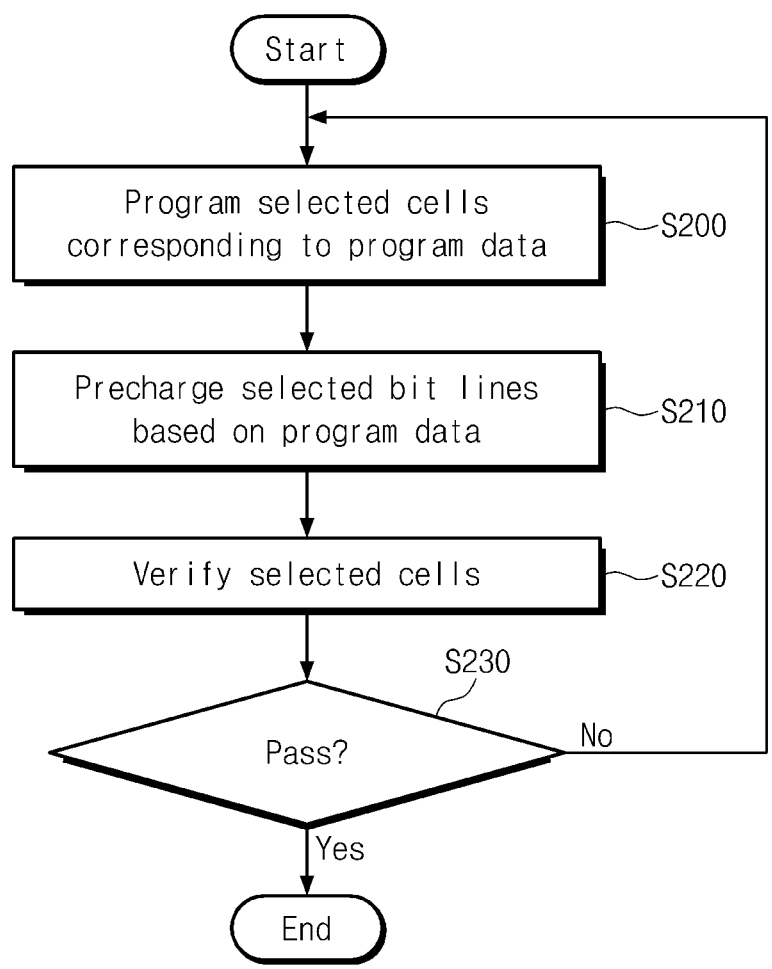
FIG. 8 is a flow chart illustrating a program method according to another exemplary embodiment of the present general inventive concept.

FIG. 8 is a flow chart illustrating a program method according to another exemplary embodiment of the present general inventive concept. Referring to FIG. 8, the control logic 150 may control a pre-charge time based on data to be programmed at memory cells. Since a target program state of a selected memory cell is determined according to data to be programmed at the selected memory cell, whether the selected memory cell necessitates program verification may be determined according to data to be programmed at the selected memory cell. For example, the higher the number of '0' bits included in data to be programmed, the less the number of selected bit lines. The reason may be that the number of memory cells to be program inhibited increases.

Accordingly, data to be programmed at memory cells and capacitance of selected bit lines may be correlated. The control logic 150 may reduce a time taken to perform a program verification operation by shortening a pre-charge time according to data to be programmed.

In operation S200, selected memory cells may be programmed according to input program data.

In operation S210, bit lines corresponding respectively to the selected memory cells may be pre-charged during a pre-charge time determined based on the input program data.

In operation S220, a program verification read operation on the selected memory cells may be performed according to voltages pre-charged in operation S210.

In operation S230, whether the selected memory cells reach a target program state may be determined according to a result of the program verification read operation. If the selected memory cells are determined not to reach a target program state, the method proceeds to operation S200. If the selected memory cells are determined to reach a target program state, the method may be ended.

According to the above description, program efficiency may be improved by controlling a pre-charge time such that a program verification time is shortened.

Figure 9:
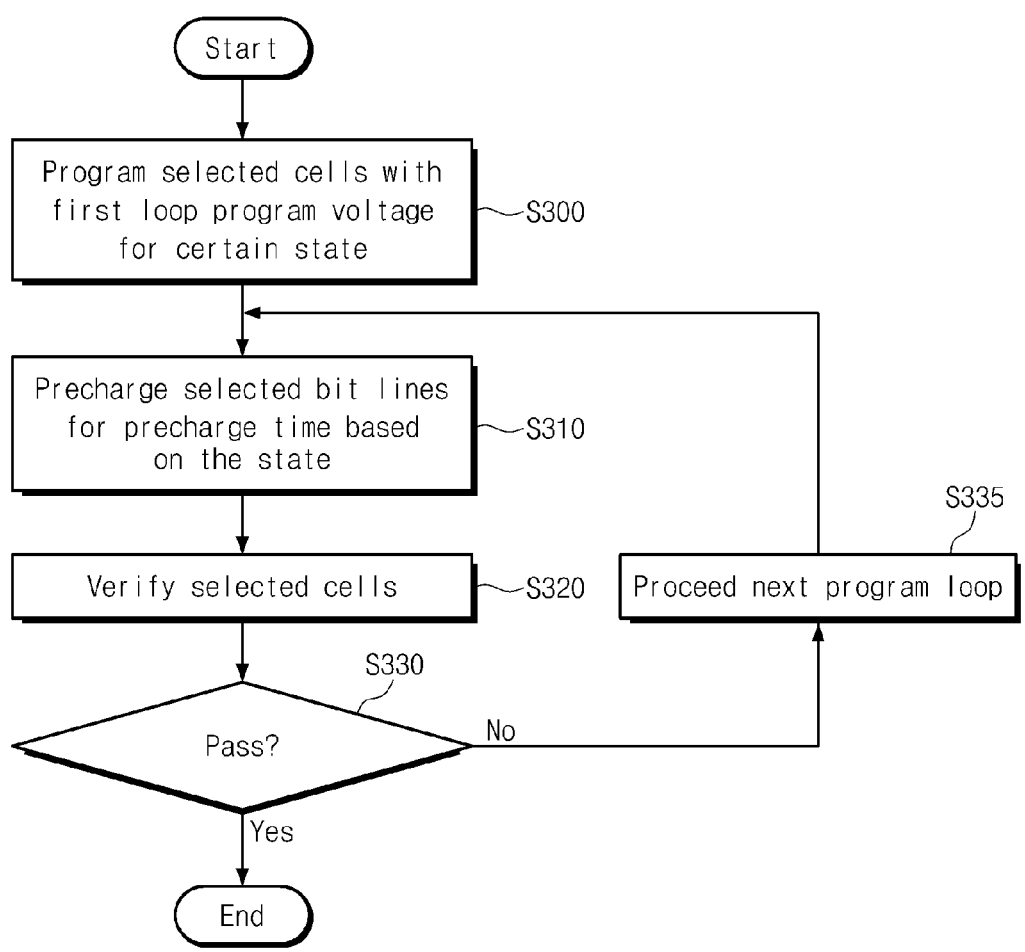
FIG. 9 is a flow chart illustrating a program method according to still another exemplary embodiment of the present general inventive concept.

FIG. 9 is a flow chart illustrating a program method according to still another exemplary embodiment of the present general inventive concept. Referring to FIG. 9, the control logic 150 may control a pre-charge time based on program states to be verified at a program operation. In multi-bit memory cells each having one of two or more states, the number of memory cells having a first target program state may be different from the number of memory cells having a second target program state different from the first target program state. For example, in the event that a verification read operation is performed with respect to memory cells each having a program state the threshold voltage of which is high, the number of memory cells necessitating read verification may be less. The control logic 150 may reduce a pre-charge time based on a program state to be verified. Thus, it is possible to shorten a time taken to perform a program verification operation.

In operation S300, selected memory cells may be programmed by a first loop program voltage corresponding to a target program state.

In operation S310, bit lines corresponding respectively to the selected memory cells may be pre-charged during a pre-charge time determined based on a target program state.

In operation S320, a program verification read operation on the selected memory cells may be performed according to voltages pre-charged in operation S310.

In operation S330, whether the selected memory cells reach a target program state may be determined according to a result of the program verification read operation. If the selected memory cells are determined to reach a target program state, program operation for the target program state is completed.

In operation S335, a next program loop may be performed if the selected memory cells are determined not to have reached a target program state. Selected memory cells may be programmed by an increased program voltage.

According to the above description, program efficiency may be improved by controlling a pre-charge time such that a program verification time is shortened.

Figure 10:
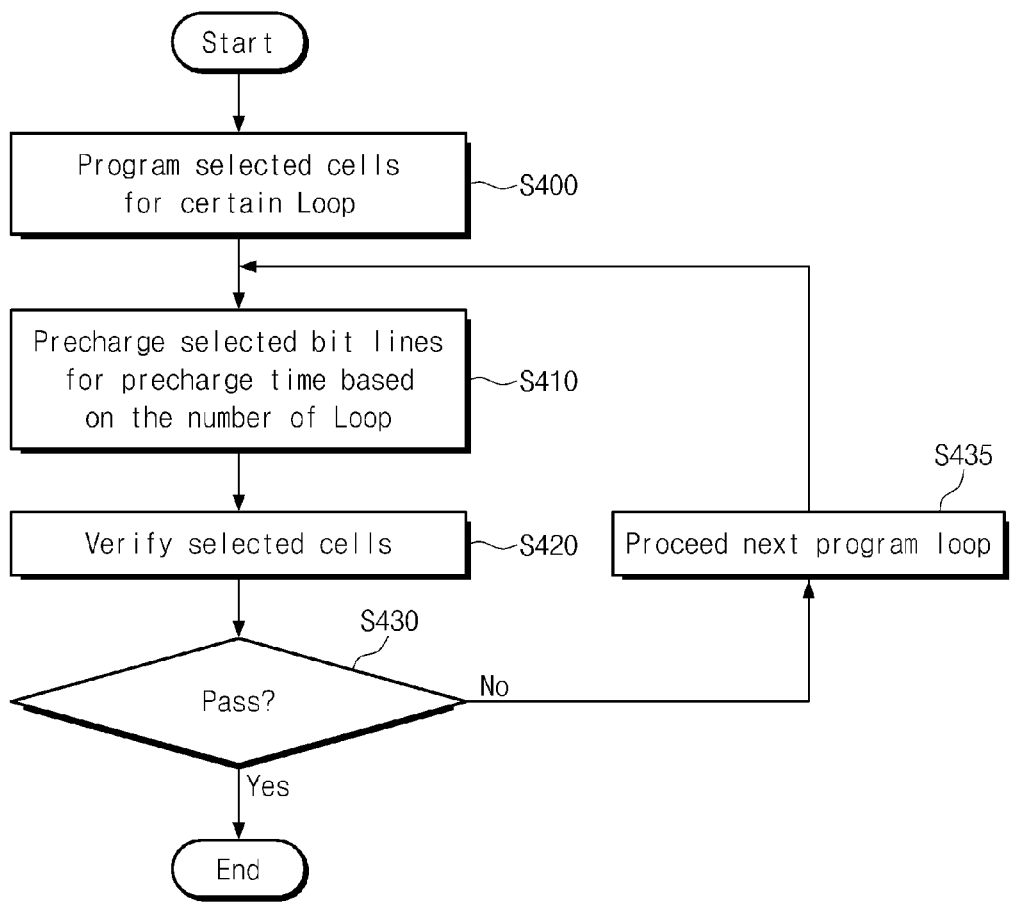
FIG. 10 is a flow chart illustrating a program method according to still another exemplary embodiment of the present general inventive concept.

FIG. 10 is a flow chart illustrating a program method according to still another exemplary embodiment of the present general inventive concept. Referring to FIG. 10, the control logic 150 may control a pre-charge time based on a program loop number at a program operation. As the program loop number increases, states of memory cells may reach a target program state, so that the number of memory cells to be program inhibited increases. Accordingly, as the program loop number increases, the number of selected bit lines and capacitance of the selected bit lines may decrease. The control logic 150 may shorten a pre-charge time according to the program loop number. This may mean that a time taken to perform program verification is reduced.

In operation S400, selected memory cells may be programmed by a program voltage at an nth loop.

In operation S410, bit lines corresponding respectively to the selected memory cells may be pre-charged during a pre-charge time determined based on a program loop number.

In operation S420, a program verification read operation on the selected memory cells may be performed according to voltages pre-charged in operation S410.

In operation S430, whether the selected memory cells reach a target program state may be determined according to a result of the program verification read operation.

If the selected memory cells are determined not to have reached a target program state, the method proceeds to operation S435. In operation S435, an increased program voltage may be again applied such that a program operation is performed at an (n+1)th program loop.

According to the above description, program efficiency may be improved by controlling a pre-charge time such that a program verification time is shortened.

Figure 11:
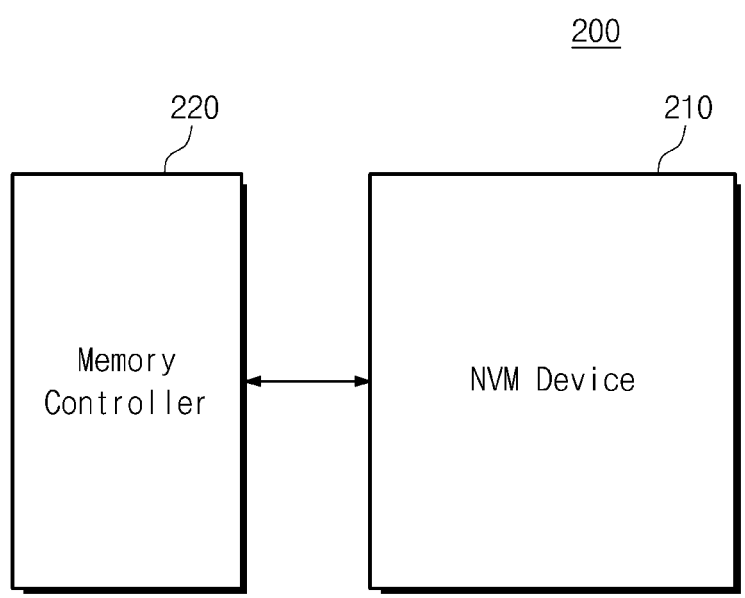
FIG. 11 is a block diagram schematically illustrating a memory system according to an exemplary embodiment of the present general inventive concept.

FIG. 11 is a block diagram schematically illustrating a memory system according to an exemplary embodiment of the present general inventive concept. Referring to FIG. 11, a memory system 200 of the present general inventive concept may include a memory controller 210 and a nonvolatile memory device 220. The memory controller 210 may control the nonvolatile memory device 220. The memory controller 210 may control a verification read time of the nonvolatile memory device 220 using a command.

The nonvolatile memory device 220 may perform a verification read operation on memory cells based on the command from the memory controller 210. The nonvolatile memory device 220 may change a verification read time according to the command from the memory controller 210. Thus, it is possible to shorten a time taken to perform a program verification operation.

Figure 12:
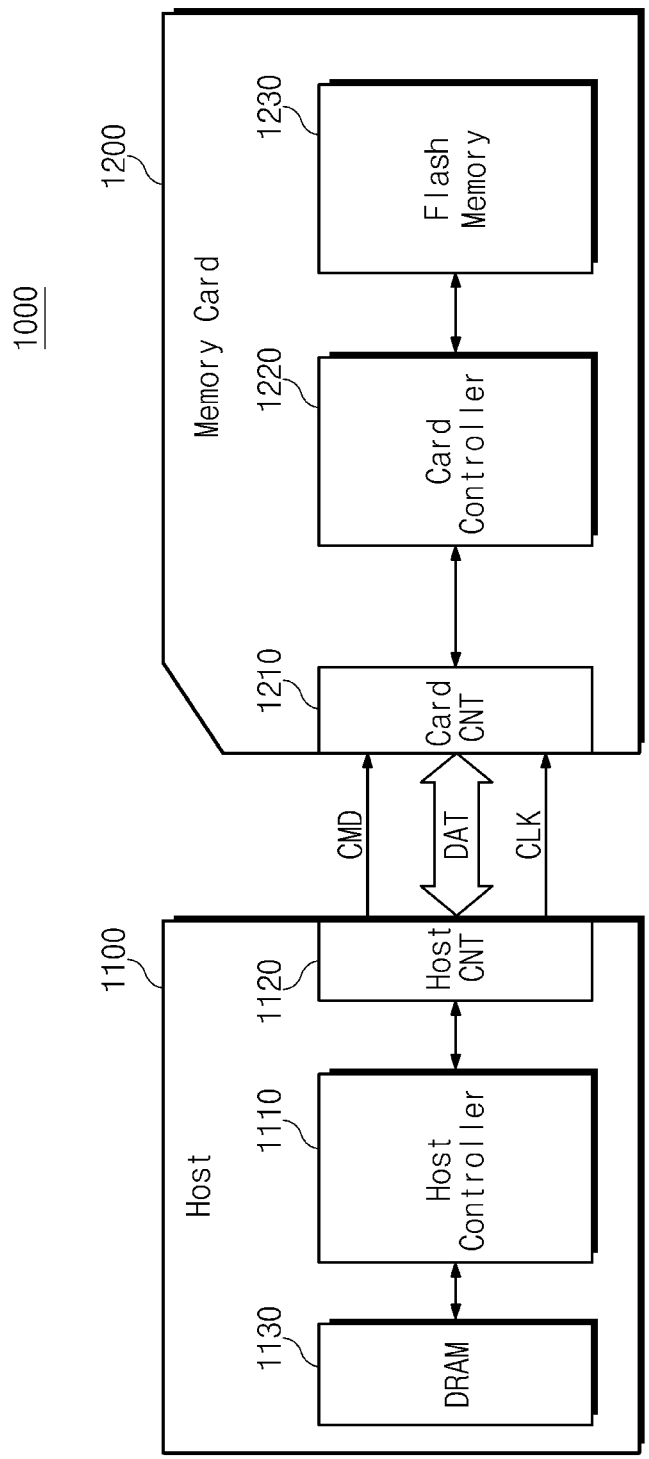
FIG. 12 is a block diagram schematically illustrating a memory card system to which a memory system according to an exemplary embodiment of the present general inventive concept is applied.

FIG. 12 is a block diagram schematically illustrating a memory card system 1000 to which a memory system according to an exemplary embodiment of the present general inventive concept is applied. The memory card system 1000 may include a host 1100 and a memory card 1200. The host 1100 may include a host controller 1110, a host connection unit 1120, and a DRAM 1130.

The host 1100 may write data into the memory card 1200 and read data from the memory card 1200. The host controller 1110 may send a command (e.g., a write command), a clock signal CLK generated from a clock generator (not illustrated) in the host 1100, and data to the memory card 1200 via the host connection unit 1120. The DRAM 1130 may be a main memory of the host 1100.

The memory card 1200 may include a card connection unit 1210, a card controller 1220, and a flash memory 1230. The card controller 1220 may store data in the flash memory 1230 in response to a command input via the card connection unit 1210. The data may be stored in synchronization with a clock signal generated from a clock generator (not illustrated) in the card controller 1220. The flash memory 1230 may store data transferred from the host 1100. For example, in the event that the host 1100 is a digital camera, the flash memory 1230 may store image data.

The memory card system 1000 in FIG. 12 may control a pre-charge time of a program verification read operation when data is programmed at the flash memory 1230. Thus, it is possible to reduce a program verification time.

Figure 13:
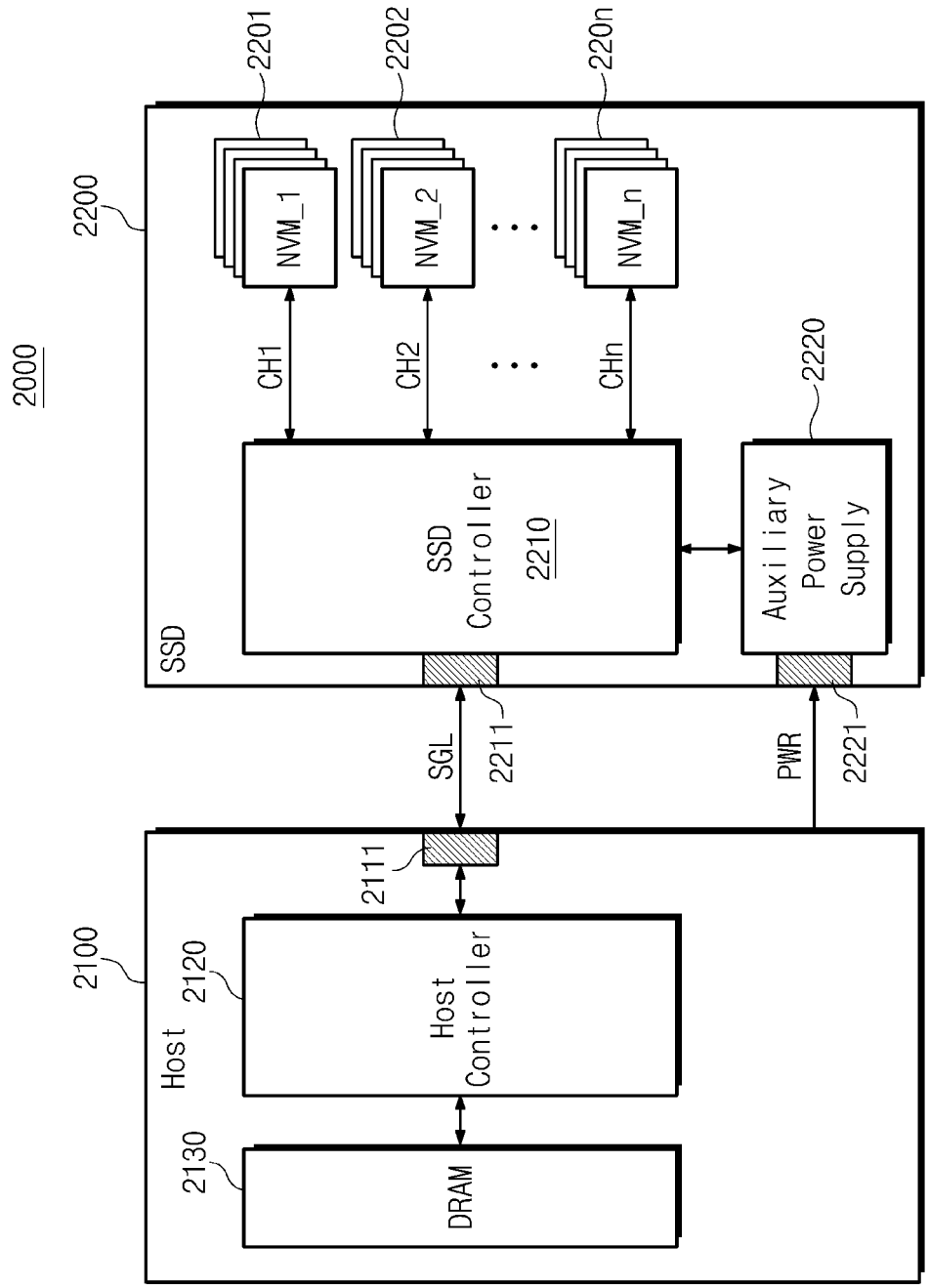
FIG. 13 is a block diagram illustrating a solid state drive system in which a memory system according to exemplary embodiment of the present general inventive concept is applied.

FIG. 13 is a block diagram illustrating a solid state drive system 2000 in which a memory system according to the inventive concept is applied. Referring to FIG. 13, the solid state drive (SSD) system 2000 may include a host 2100 and an SSD 2200. The host 2100 may include an SSD interface 2111, a host controller 2120, and a DRAM 2130.

The host 2100 may write data in the SSD 2200 or read data from the SSD 2200. The host controller 2120 may transfer signals SGL such as a command, an address, a control signal, etc., to the SSD 2200 via the SSD interface 2111. The DRAM 2130 may be a main memory of the host 2100.

The SSD 2200 may exchange signals SGL with the host 2100 via a host interface 2211, and may be supplied with a power via a power connector 2221. The SSD 2200 may include a plurality of nonvolatile memories 2201 through 220n, an SSD controller 2210, and an auxiliary power supply 2220. Herein, the nonvolatile memories 2201 to 220n may be implemented by not only a NAND flash memory but also PRAM, MRAM, ReRAM, and so on.

The plurality of nonvolatile memories 2201 through 220n may be used as a storage medium of the SSD 2200. The plurality of nonvolatile memories 2201 through 220n may be connected with the SSD controller 2210 via a plurality of channels CH1 through CHn. One channel may be connected with one or more nonvolatile memories. Nonvolatile memories connected with one channel may be connected with the same data bus.

The SSD controller 2210 may exchange signals SGL with the host 2100 via the host interface 2211. Herein, the signals SGL may include a command, an address, data, etc. The SSD controller 2210 may be configured to write or read out data to or from a corresponding nonvolatile memory according to a command of the host 2100. The SSD controller 2210 will be more fully described with reference to FIG. 14.

The auxiliary power supply 2220 may be connected with the host 2100 via the power connector 2221. The auxiliary power supply 2220 may be charged by a power PWR from the host 2100. The auxiliary power supply 2220 may be placed within the SSD 2200 or outside the SSD 2200. For example, the auxiliary power supply 2220 may be put on a main board to supply an auxiliary power to the SSD 2200.

Figure 14:
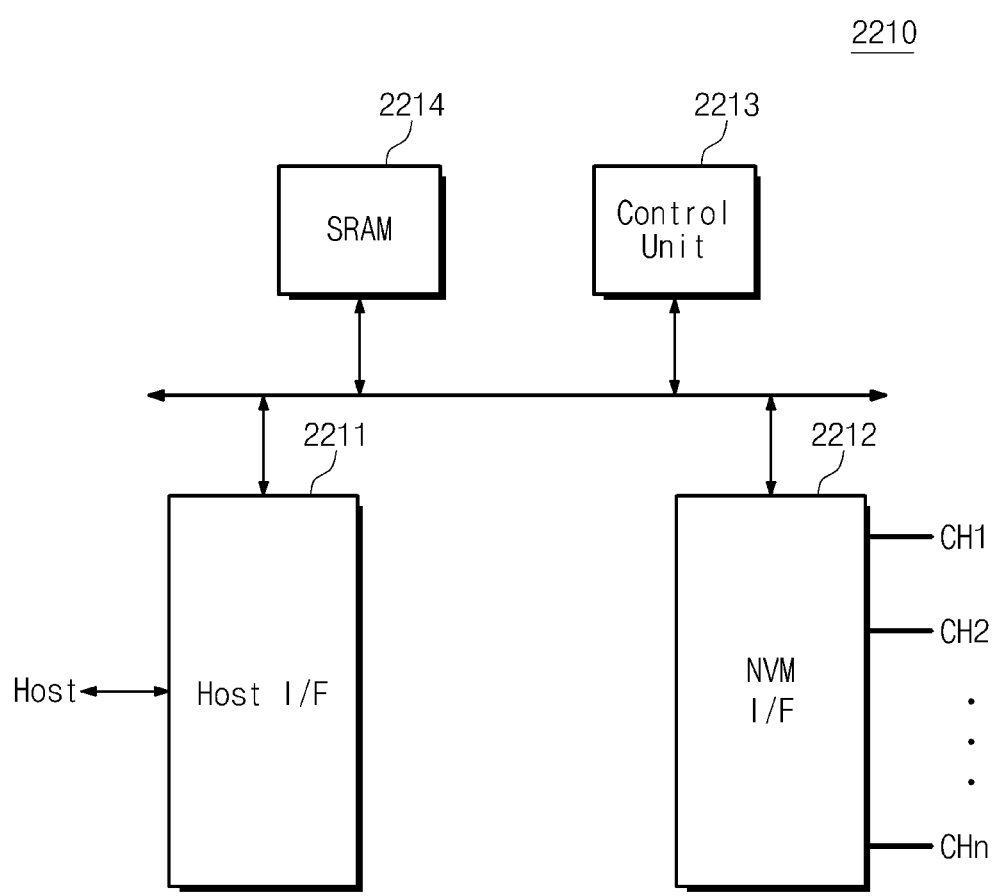
FIG. 14 is a block diagram schematically illustrating an SSD controller in FIG. 13.

FIG. 14 is a block diagram schematically illustrating the SSD controller 2210 including the host interface 2211 of FIG. 13. Referring to FIG. 14, the SSD controller 2210 may include the host interface 2211, an NVM interface 2212, a control unit 2213, and an SRAM 2214.

The NVM interface 2212 may scatter data transferred from a main memory of the host 2100 of FIG. 13 to channels CH1 through CHn, respectively. The NVM interface 2212 may transfer data read from nonvolatile memories 2201 through 220n to the host 2100 via the host interface 2211.

The host interface 2211 may provide an interface with an SSD 2200 according to the protocol of the host 2100. The host interface 2211 may communicate with the host 2100 using USB (Universal Serial Bus), SCSI (Small Computer System Interface), PCI express, ATA, PATA (Parallel ATA), SATA (Serial ATA), SAS (Serial Attached SCSI), etc. The host interface 2211 may perform a disk emulation function that enables the host 2100 to recognize the SSD 2200 as a hard disk drive (HDD).

The control unit 2213 may analyze and process a signal SGL input from the host 2100. The control unit 2213 may control the host 2100 or the nonvolatile memories 2201 through 220n via the host interface 2211 or the NVM interface 2212. The control unit 2213 may control the nonvolatile memories 2201 through 220n according to firmware to drive the SSD 2200.

The SRAM 2214 may be used to drive software which efficiently manages the nonvolatile memories 2201 through 220n. The SRAM 2214 may store metadata input from a main memory of the host 2100 or cache data. At a sudden power-off operation, metadata or cache data stored in the SRAM 2214 may be stored in the nonvolatile memories 2201 through 220n using an auxiliary power supply 2220.

Returning to FIG. 13, the SSD system 2000 may control a pre-charge time of a program verification read operation when data is programmed at the nonvolatile memories 2201 through 220n. Thus, it is possible to reduce a program verification time.

In FIGS. 13 and 14, the SRAM 2214 may be replaced with a nonvolatile memory. The SRAM 2214 of the SSD system 2000 can be replaced with a nonvolatile memory such as PRAM, RRAM, MRAM, etc., but is not limited thereto.

Figure 15:
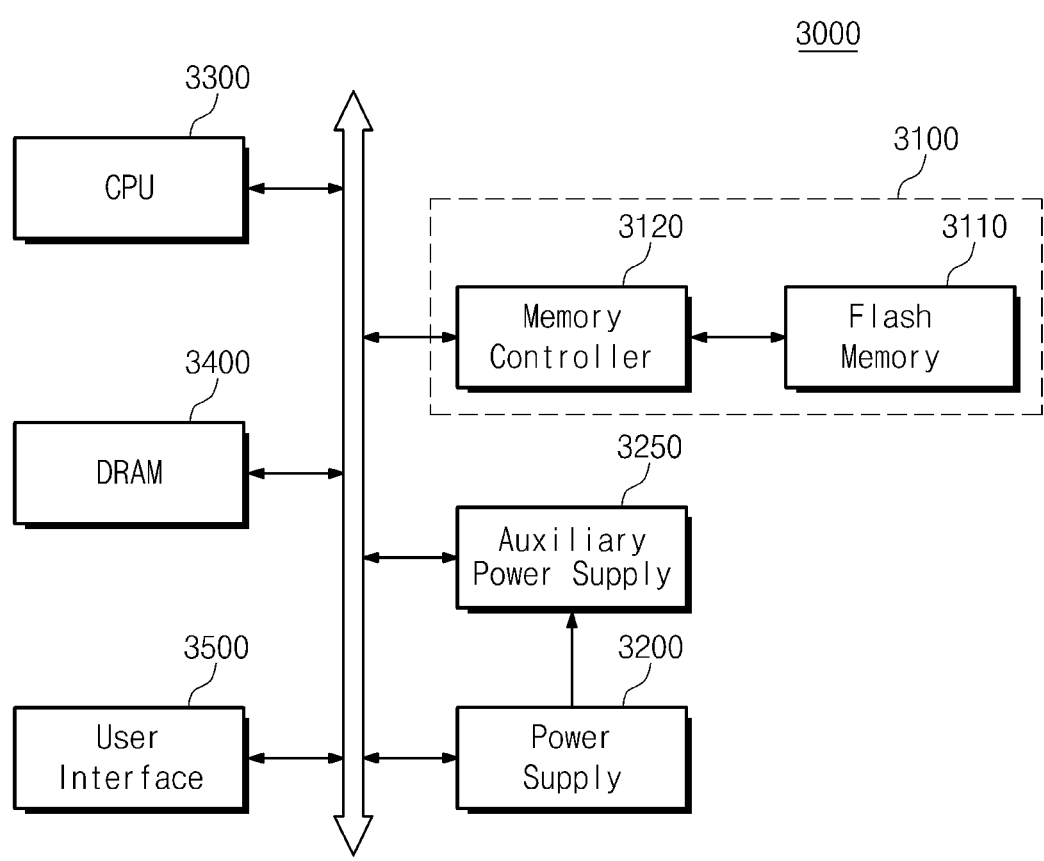
FIG. 15 is a block diagram schematically illustrating an electronic device including a memory system according to an exemplary embodiment of the present general inventive concept.

FIG. 15 is a block diagram schematically illustrating an electronic device 3000 including a memory system according to an exemplary embodiment of the present general inventive concept. Herein, the electronic device 3000 may be a personal computer or a handheld electronic device such as a notebook computer, a cellular phone, a PDA, a camera, etc., but is not limited thereto.

Referring to FIG. 15, the electronic device 3000 may include a memory device 3100, a power supply device 3200, an auxiliary power supply 3250, a CPU 3300, a DRAM 3400, and a user interface 3500. The memory device 3100 may include a flash memory 3110 and a memory controller 3120. The memory device 3100 may be embedded within the electronic device 3000, or may be detachable therefrom.

As described above, the electronic device 3000 may control a pre-charge time of a program verification read operation in response to data being programmed at the flash memory 3110. Thus, it is possible to reduce a program verification time.

The present general inventive concept may be modified or changed variously. For example, a nonvolatile memory and a memory controller may be changed or modified variously according to environment and use.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nonvolatile memory device, comprising:
a memory cell array including a plurality of memory cells;
a page buffer circuit connected with the memory cell array via a plurality of bit lines and configured to selectively pre-charge the plurality of bit lines; and
control logic configured to control the page buffer circuit such that a pre-charge voltage is applied to selected bit lines of the plurality of bit lines during a first time at a read operation and such that a pre-charge voltage is applied to selected bit lines of the plurality of bit lines during a second time different from the first time at a verification read operation, wherein the second time is determined based on a number of selected bit lines of the plurality of bit lines at the verification read operation.

2. The nonvolatile memory device of claim 1, wherein the second time is shorter than the first time.

3. The nonvolatile memory device of claim 1, wherein the second time is shortened when the number of bit lines selected at the verification read operation decreases.

4. The nonvolatile memory device of claim 1, wherein the page buffer circuit comprises:

a selective pre-charge unit configured to apply a pre-charge voltage to selected bit lines of the plurality of bit lines; and a latch unit connected with the plurality of bit lines and the selective pre-charge unit and configured to latch data to be programmed at the memory cell array.

5. The nonvolatile memory device of claim 4, wherein the selective pre-charge unit comprises selection transistors connected respectively with the plurality of bit lines and configured to apply a pre-charge voltage to selected bit lines.

6. The nonvolatile memory device of claim 5, wherein the selective pre-charge unit further comprises ground transistors connected with the plurality of bit lines and configured to ground unselected bit lines.

7. The nonvolatile memory device of claim 1, wherein the number of bit lines selected at the verification read operation is determined on the basis of data to be programmed at the memory cell array.

8. The nonvolatile memory device of claim 7, wherein the number of bit lines selected at the verification read operation is determined on the basis of the number of '0' bits included in data to be programmed at the memory cell array.

9. The nonvolatile memory device of claim 8, wherein the second time is reduced when the number of '0' bits included in data to be programmed at the memory cell array increases.

10. A nonvolatile memory device, comprising:

a memory cell array including a plurality of memory cells;

a page buffer circuit connected with the memory cell array via a plurality of bit lines and configured to selectively pre-charge the plurality of bit lines; and control logic configured to control the page buffer circuit such that a pre-charge voltage is applied to selected bit lines of the plurality of bit lines during a first time at a read operation and such that a pre-charge voltage is applied to selected bit lines of the plurality of bit lines during a second time different from the first time at a verification read operation, wherein the second time is determined based on a number of program loops at the verification read operation.

11. The nonvolatile memory device of claim 10, wherein the second time is shorter than the first time.

12. The nonvolatile memory device of claim 10, wherein the second time is shortened when the number of program loops increases.

13. A method of improving program efficiency of a nonvolatile memory device, the method comprising:

selectively pre-charging a plurality of bit lines connected with a memory cell array;

applying a pre-charge voltage to the selected bit lines during a first time at a read operation; and applying another pre-charge voltage to the selected bit lines during a second time different from the first time at a verification read operation, wherein the second time is determined based on a number of selected bit lines of the plurality of bit lines at the verification read operation.

14. The method of claim 13, wherein the second time is shorter than the first time.

15. The method of claim 13, wherein the second time is shortened when the number of bit lines selected at the verification read operation decreases.

16. The method of claim 13, wherein the number of bit lines selected at the verification read operation is determined on the basis of data to be programmed at the memory cell array.

17. The method of claim 13, wherein the number of bit lines selected at the verification read operation is determined on the basis of the number of '0' bits included in data to be programmed at the memory cell array.

18. A method of improving program efficiency of a nonvolatile memory device, the method comprising:

selectively pre-charging a plurality of bit lines connected with a memory cell array;

applying a pre-charge voltage to the selected bit lines during a first time at a read operation; and applying another pre-charge voltage to the selected bit lines during a second time different from the first time at a verification read operation, wherein the second time is determined on the basis of a program state to be verified at a verification read operation.

19. The method of claim 18, wherein the second time is shorter than the first time.

20. The method of claim 18, wherein the second time is shortened when a threshold voltage of a program state to be verified increases.

* * * * *